United States Patent
Nam

(10) Patent No.: US 8,445,988 B2
(45) Date of Patent: May 21, 2013

(54) APPARATUS AND METHOD FOR PLASMA PROCESSING

(75) Inventor: Chang Kil Nam, Gyeonggi-do (KR)

(73) Assignee: Jusung Engineering Co., Ltd (KR)

( * ) Notice: Subject to any disclaimer, the term of this patent is extended or adjusted under 35 U.S.C. 154(b) by 0 days.

(21) Appl. No.: 12/885,032

(22) Filed: Sep. 17, 2010

(65) Prior Publication Data

US 2011/0117682 A1    May 19, 2011

(30) Foreign Application Priority Data

Sep. 17, 2009   (KR) .......................... 10-2009-0087972

(51) Int. Cl.
  *H01L 29/00*     (2006.01)
  *H01L 21/00*     (2006.01)
(52) U.S. Cl.
  USPC .......................................... 257/516; 438/10
(58) Field of Classification Search
  None
  See application file for complete search history.

(56) References Cited

U.S. PATENT DOCUMENTS

2003/0097987 A1*   5/2003   Fukuda ................ 118/723 E
2009/0105980 A1*   4/2009   Tetsuka et al. ............ 702/76

FOREIGN PATENT DOCUMENTS

KR    P1997-0028874    6/1997
KR    10-2007-0116297    12/2007

* cited by examiner

*Primary Examiner* — Fernando L Toledo
*Assistant Examiner* — Valerie N Newton
(74) *Attorney, Agent, or Firm* — Renaissance IP Law Group LLP

(57) ABSTRACT

Disclosed is an apparatus and method for plasma processing, which facilitates to constantly control a RF voltage supplied to a substrate supporting member by precisely detecting an inductive RF voltage induced to the substrate supporting member for a plasma, the apparatus comprising: a substrate supporting member for supporting a substrate, installed in a reaction room of a processing chamber; a RF generator for supplying a RF voltage to the substrate supporting member so as to form plasma in the reaction room; and a matching device for matching impedance of the RF voltage to be supplied to the substrate supporting member from the RF generator, wherein the matching device comprises: a matching unit for matching the impedance of RF voltage; and an inductive RF detecting unit which an inductive RF detecting voltage by removing noise frequency elements except a waveform of the RF voltage from a waveform of an inductive RF voltage induced to the substrate supporting member, and supplies the detected inductive RF detecting voltage to the RF generator so as to control the RF voltage.

9 Claims, 3 Drawing Sheets

Time(u seconds)

Frequency

Time(u seconds)

Time(u seconds)

Time(u seconds)

APPARATUS AND METHOD FOR PLASMA PROCESSING

CROSS REFERENCE TO RELATED APPLICATIONS

This application claims the benefit of the Korean Patent Application No. P2009-0087972 filed on Sep. 17, 2009, which is hereby incorporated by reference as if fully set forth herein.

BACKGROUND

1. Field of the Invention

The present invention relates to an apparatus for plasma processing, and more particularly, to an apparatus and method for plasma processing, which facilitates to constantly control a RF voltage supplied to a substrate supporting member by precisely detecting an inductive RF voltage induced to the substrate supporting member for a plasma process.

2. Discussion of the Related Art

Generally, an apparatus for plasma processing may include a plasma enhanced chemical vapor deposition (PECVD) apparatus to deposit a thin film, an etching apparatus to etch and pattern the deposited thin film, a sputtering apparatus, and an ashing apparatus.

According to a method for applying RF power, the apparatus for plasma processing may be largely classified into a capacitively-coupled plasma (CCP) method and an inductively-coupled plasma (ICP) method.

The CCP method generates plasma through the use of electric field occurring between electrodes when a RF voltage is applied to facing parallel-plate electrodes. In case of the ICP method, a source material is transformed into plasma through the use of inductive electric field induced by an antenna.

The general apparatus for plasma processing generates plasma through the use of processing gas by supplying the RF voltage to a substrate supporting member for loading a processed substrate (wafer or semiconductor substrate), to thereby carry out the plasma process.

In order to ensure reliability of the plasma process in the general apparatus for plasma processing, it is necessary to constantly maintain the RF voltage supplied to the substrate supporting member.

SUMMARY

Accordingly, the present invention is directed to an apparatus and method for plasma processing that substantially obviates one or more problems due to limitations and disadvantages of the related art.

An object of the present invention is to provide an apparatus and method for plasma processing, which facilitates to constantly control a RF voltage supplied to a substrate supporting member by precisely detecting an inductive RF voltage induced to the substrate supporting member for a plasma process.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

Based on a measurement result from a portion supplied with a RF voltage in a substrate supporting member of an apparatus for plasma processing, as shown in FIG. 1, it is known that a RF peak-to-peak voltage value without reliability is detected due to a wavelength distortion. Herein, several wavelengths (A, B, C) are detected by a spectrum analysis, as shown in FIG. 2.

An analysis result of the waveform in each wavelength (A, B, C) shows that the waveform of the RF peak-to-peak voltage is distorted due to mixture of the several wavelengths (A, B, C). That is, the "A" wavelength corresponds to the waveform (hereinafter, referred to as "input waveform") of RF voltage supplied to the substrate supporting member as shown in FIG. 3A; the "B" wavelength corresponds to the mixed waveform of the input waveform and a noise waveform, wherein the noise waveform is twice the input waveform; and the "C" wavelength corresponds to the mixed waveform of the input waveform and a noise waveform, wherein the noise waveform is quadruple the input waveform. In this case, the noise waveform occurs by motion of plasma ions for the plasma process.

As a result, it is difficult to detect a precise inductive RF voltage induced to the substrate supporting member due to the distortion of the waveform of the RF peak-to-peak voltage detected in the substrate supporting member, that is, it is difficult to constantly maintain the RF voltage supplied to the substrate supporting member.

In order to overcome this problem, a present invention removes a noise frequency through the use of filter passing only the predetermined frequency, so that it is possible to precisely detect the inductive RF voltage induced to the substrate supporting member by preventing the waveform of the RF peak-to-peak voltage from being distorted.

To achieve these objects and other advantages and in accordance with the purpose of the invention, as embodied and broadly described herein, there is provided an apparatus for plasma processing comprising: a substrate supporting member for supporting a substrate, installed in a reaction room of a processing chamber; a RF generator for supplying a RF voltage to the substrate supporting member so as to form plasma in the reaction room; and a matching device for matching impedance of the RF voltage to be supplied to the substrate supporting member from the RF generator, wherein the matching device comprises: a matching unit for matching the impedance of RF voltage; and an inductive RF detecting unit which an inductive RF detecting voltage by removing noise frequency elements except a waveform of the RF voltage from a waveform of an inductive RF voltage induced to the substrate supporting member, and supplies the detected inductive RF detecting voltage to the RF generator so as to control the RF voltage.

The inductive RF detecting unit comprises: a first filter for removing the noise frequency elements except the waveform of the RF voltage from the waveform of the inductive RF voltage; and an inductive RF detecting circuit for detecting the inductive RF detecting voltage from the waveform of the inductive RF voltage from which the noise frequency elements are removed by the first filter.

The first filter comprises: a first inductor with both ends, wherein one end of the first inductor is connected to the substrate supporting member, and the other end of the first inductor is connected to the inductive RF detecting circuit; and a first capacitor with both ends, wherein one end of the first capacitor is connected to the other end of the first inductor, and the other end of the first capacitor is connected to the ground.

The inductive RF detecting circuit comprises: a second capacitor connected between the other end of the first inductor and an output terminal of the inductive RF detecting voltage; a third capacitor connected between the output terminal of the inductive RF detecting voltage and the ground; and a first resistance between the output terminal of the inductive RF detecting voltage and the ground.

The matching device further comprises an inductive D.C. voltage detecting unit for detecting an inductive D.C. detecting voltage by removing A.C. elements from the waveform of the inductive RF voltage induced to the substrate supporting member, and supplying the detected inductive D.C. detecting voltage to the RF generator.

The inductive D.C. voltage detecting unit comprises: a second filter for removing the A.C. elements from the waveform of the inductive RF voltage induced to the substrate supporting member; a second resistance connected to the second filter; and a fourth capacitor connected between the second resistance and the output terminal of the inductive RF detecting voltage.

The second filter comprises: a second inductor with both ends, wherein one end of the second inductor is connected to the substrate supporting member, and the other end of the second inductor is connected to the second resistance; and a fifth capacitor connected between the other end of the second inductor and the ground.

The RF generator controls the RF voltage by at least one of the inductive RF detecting voltage and the inductive D.C. detecting voltage.

In another aspect of the present invention, a method for plasma processing comprises generating a RF voltage in a RF generator; supplying the RF voltage to a substrate supporting member installed in a reaction room of a processing chamber, and thus forming plasma in the reaction room by the supplied RF voltage; removing noise frequency elements from a waveform of the RF voltage from a waveform of an inductive RF voltage induced to the substrate supporting member; detecting an inductive RF detecting voltage from the waveform of the inductive RF voltage from which the noise frequency elements are removed; and controlling the RF voltage in the RF generator according to the inductive RF detecting voltage.

The step for removing the noise frequency elements is carried out by removing the noise frequency elements from the waveform of the inductive RF voltage through the use of inductor and capacitor.

In addition, the method further comprises: removing A.C. elements from the waveform of the inductive D.C. voltage induced to the substrate supporting member; detecting an inductive D.C. detecting voltage from the waveform of the inductive D.C. voltage from which the A.C. elements are removed; and controlling the RF voltage in the RF generator according to the inductive D.C. detecting voltage.

The step for removing the A.C. elements is carried out by removing the A.C. elements from the waveform of the inductive D.C. voltage through the use of inductor and capacitor.

The step for controlling the RF voltage in the RF generator is carried out by controlling the RF voltage by at least one of the inductive RF detecting voltage and the inductive D.C. detecting voltage.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an apparatus and method for plasma processing according to the present invention will be described with reference to the accompanying drawings.

Figure 4:
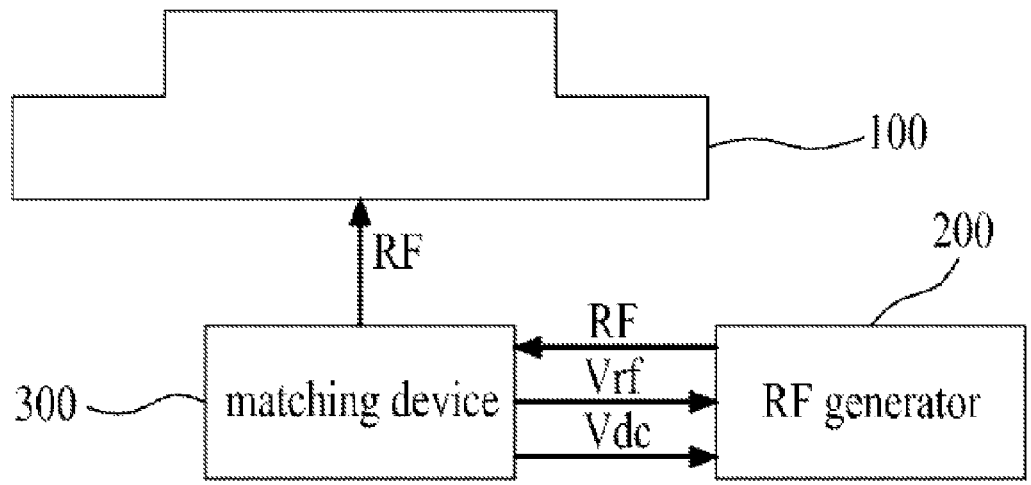
FIG. 4 illustrates an apparatus for plasma processing according to the embodiment of the present invention.

FIG. 4 illustrates an apparatus for plasma processing according to the embodiment of the present invention.

Referring to FIG. 4, the apparatus for plasma processing according to the embodiment of the present invention may include a substrate supporting member 100, a RF generator 200, and a matching device 300.

The substrate supporting member 100 is installed in a processing chamber (not shown), and the substrate supporting member 100 supports at least one substrate (not shown). In this case, the substrate supporting member 100 may be a susceptor or electrostatic chuck (ESC). If the substrate supporting member 100 may be formed of the ESC, the substrate supporting member 100 may be provided with an electrode, wherein a D.C. voltage for sticking the substrate to the ESC is supplied to the electrode.

In addition, a heater (not shown) for regulating a temperature of the substrate may be provided in the substrate supporting member 100. The heater may include an inside heater provided inside the substrate supporting member 100, and an outside heater provided outside the substrate supporting member 100. Each of the outside and inside heaters may be formed in a concentric-circle shape.

The RF generator 200 generates a RF voltage to generate plasma in a reaction room of the processing chamber, and then supplies the generated RF voltage to the substrate supporting member 100.

The matching device 300 matches source impedance with load impedance of the RF voltage supplied to the substrate supporting member 100 from the RF generator 200. Generally, in the apparatus for plasma processing, the optimal matching of the RF voltage can be obtained when inside impedance of the RF voltage is identical to inside impedance of the processing chamber.

Figure 5:
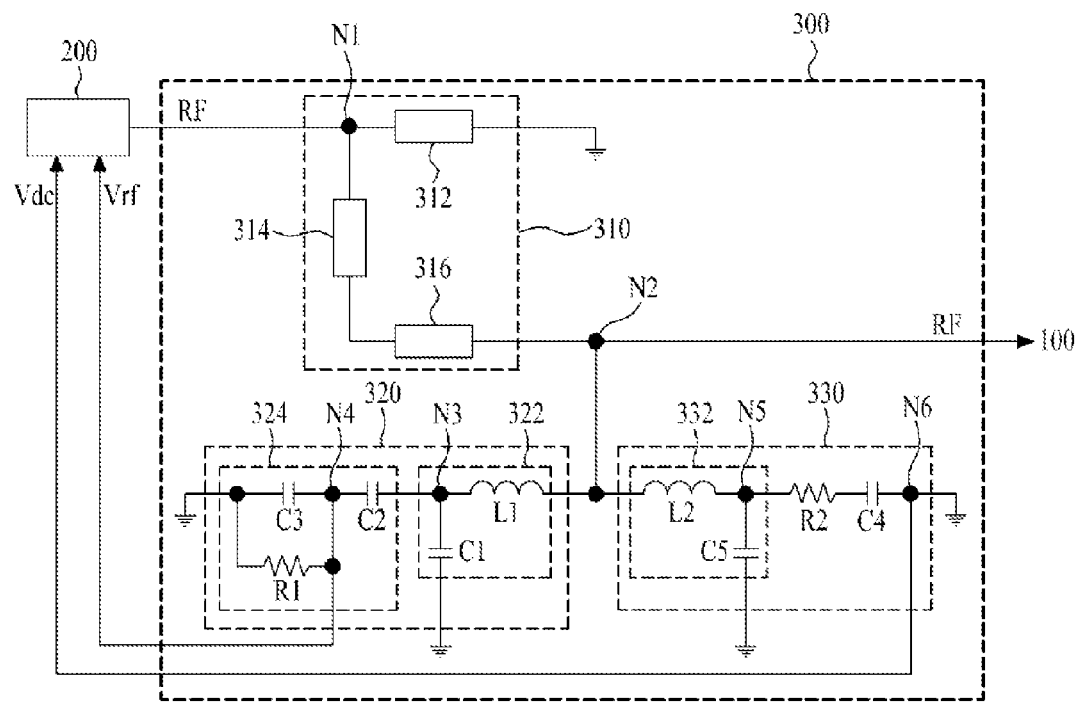
FIG. 5 illustrates a circuit diagram for explaining a matching device shown in FIG. 4 according to the embodiment of the present invention.

For this, as shown in FIG. 5, the matching device 300 may comprise a matching unit 310, and an inductive RF detecting unit 320.

The matching unit 310 may comprise first to third impedance matching elements 312, 314, and 316.

The first impedance matching element 312 functions as a capacitor connected between the ground and a first node (N1) connected to an output terminal of the RF generator 200, to thereby match active power. In this case, the first impedance matching element 312 may be a variable capacitor whose impedance value is varied by a controller (not shown).

The second impedance matching element 314 functions as an inductor connected between the first node (N1) and one end of the third impedance matching element 316, to thereby match reactive power.

The third impedance matching element 316 functions as a capacitor connected between the second impedance matching element 314 and a second node (N2) corresponding to an output terminal of the RF voltage, to thereby match reactive power. In this case, the third impedance matching element 316 may be a variable capacitor whose impedance value is varied by the controller (not shown).

The matching unit 310 varies the impedance value based on the variable capacity of the first and third impedance matching elements 312 and 316 under control of the controller on applying the RF voltage, to thereby match the source impedance with the load impedance of the RF voltage.

The RF detecting unit 320 may comprise a first filter 322, and an inductive RF detecting circuit 324.

The first filter 322 may comprise a first inductor (L1), and a first capacitor (C1).

One end of the first inductor (L1) is connected to the second node (N2), and the other end of the first inductor (L1) is connected to a third node (N3).

The first capacitor (C1) is connected between the ground and the third node (N3).

Figure 1:
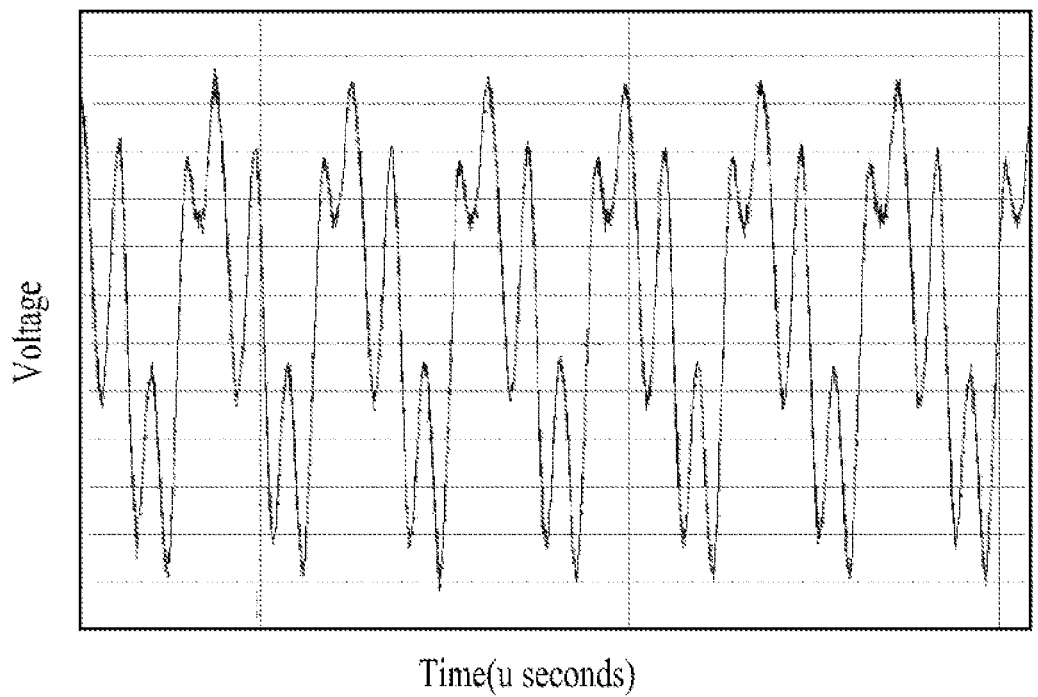
FIG. 1 is a waveform diagram for explaining an inductive RF voltage induced to a substrate supporting member in a related art apparatus for plasma processing.
Figure 2:
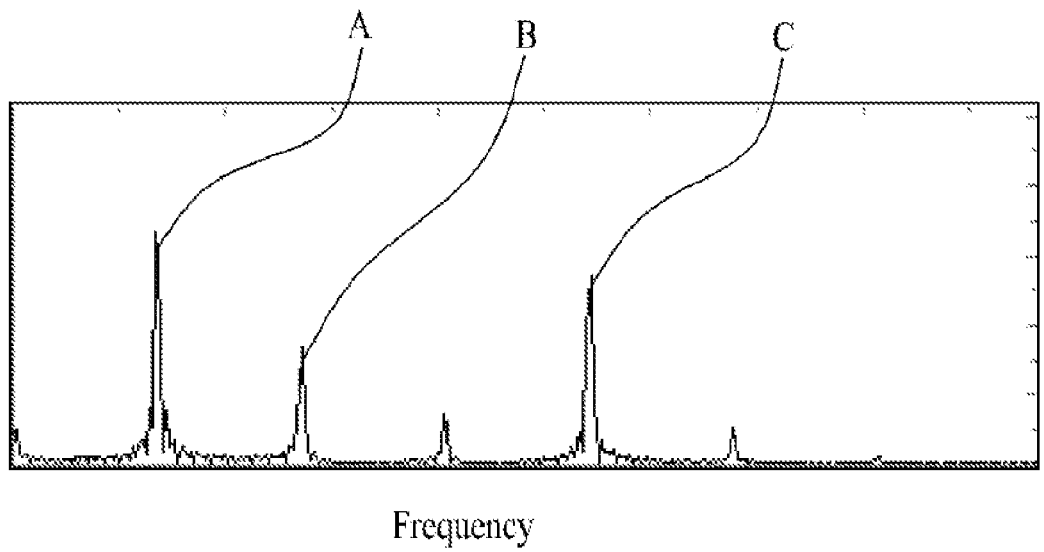
FIG. 2 is a waveform diagram for explaining a spectrum of the inductive RF voltage shown in FIG. 1.
Figure 3A:
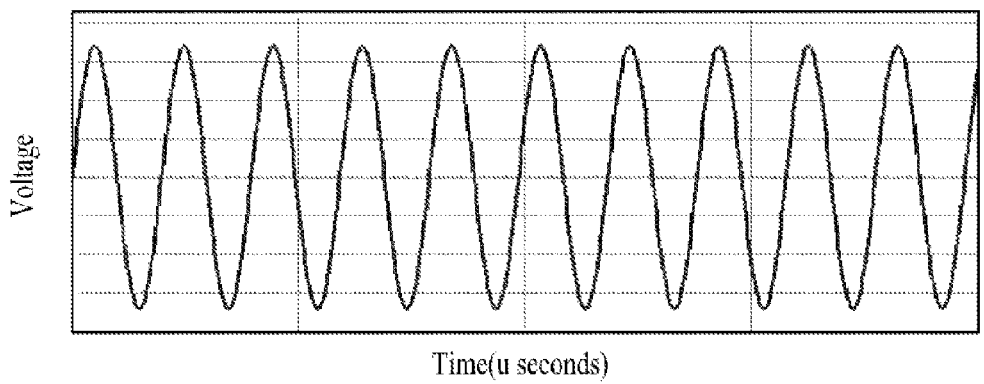
FIG. 3A is a waveform diagram for explaining a waveform of a RF voltage supplied to the substrate supporting member in the related art apparatus for plasma processing.
Figure 3B:
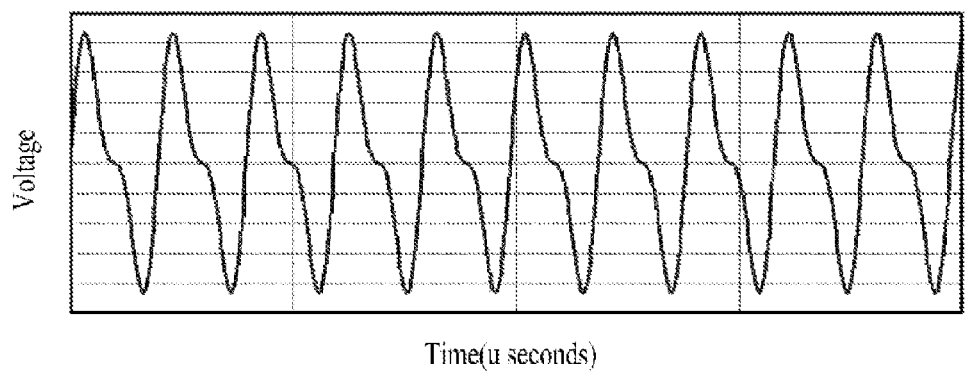
FIGS. 3B and 3C are waveform diagrams for explaining a noise frequency waveform mixed in a waveform of the inductive RF voltage induced to the substrate supporting member in the related art apparatus for plasma processing.
Figure 3C:
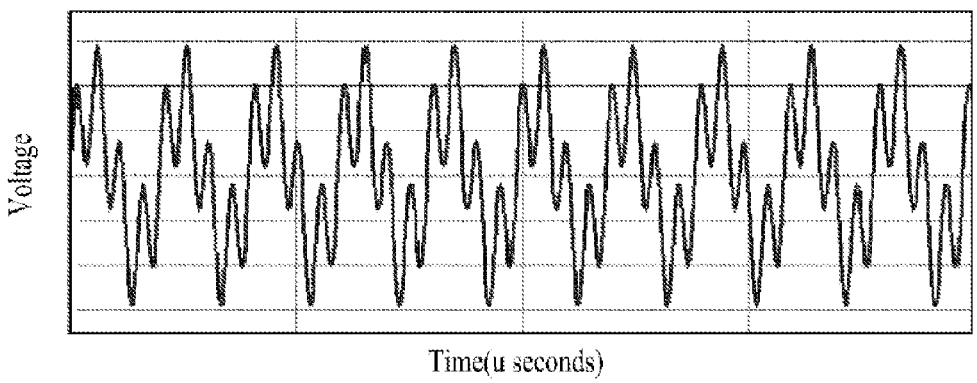

The first filter 322 passes only the desired frequency through the use of first inductor (L1) and first capacitor (C1), to thereby remove noise RF elements from the inductive RF voltage induced to the substrate supporting member 100 via the second node (N2). For example, as shown in FIG. 1, the first filter 322 passes only the waveform (See FIG. 3A) of the RF voltage supplied to the substrate supporting member 100 among the waveform of the inductive RF voltage induced to the substrate supporting member 100 via the second node (N2), and removes noise frequency (See FIGS. 3B and 3C) from the waveforms of the inductive RF voltage. Thus, the waveform of the inductive RF voltage outputted by the first filter 322 has a RF peak-to-peak voltage value with high reliability, as shown in FIG. 3A.

The inductive RF detecting circuit 324 detects an inductive RF detecting voltage (Vrf) from the waveform of the inductive RF voltage from which the noise frequency is removed by the first filter 322, and then supplies the detected inductive RF detecting voltage (Vrf) to the RF generator 200.

For this, the inductive RF detecting circuit 324 may comprise second and third capacitors (C2, C3), and a first resistance (R1).

The second and third capacitors (C2, C3) are connected in series between the third node (N3) of the first filter 322 and the ground.

One end of the first resistance (R1) is connected to a fourth node (N4) corresponding to an output terminal of the inductive RF detecting voltage (Vrf) connected between the second and third capacitors (C2, C3), and the other end of the first resistance (R1) is connected to the ground.

The inductive RF detecting circuit 324 detects the inductive RF detecting voltage (Vrf) corresponding to the RF peak-to-peak voltage value from the waveform of the RF voltage, from which the noise frequency element is removed by the first filter 322, according to a voltage dividing ratio between the second and third capacitors (C2, C3) and the first resistance (R1).

The inductive RF detecting unit 320 removes the noise frequency element from the waveform of the inductive RF voltage through the use of first filter 322; detects the inductive RF detecting voltage (Vrf) from the waveform of the inductive RF voltage whose noise frequency element is removed by the inductive RF detecting circuit 324; and supplies the detected inductive RF detecting voltage (Vrf) to the RF generator 200. Thus, the RF generator 200 controls the level of RF voltage based on the inductive RF detecting voltage (Vrf) detected and supplied by the inductive RF detecting circuit 324, to thereby constantly maintain the RF voltage to be supplied to the substrate supporting member 100.

According to a material of thin film on the substrate in the apparatus for plasma processing, an insulating material may exist between the substrate and the substrate supporting member 100, or not. Thus, if the insulating material exists between the substrate and the substrate supporting member 100, it is impossible to detect the inductive D.C. voltage induced to the substrate supporting member 100 due to the insulating material. However, if there is no insulating material between the substrate supporting member 100 and the substrate, it is possible to detect the inductive D.C. voltage induced to the substrate supporting member 100, to thereby control the RF voltage supplied to the substrate supporting member 100 through the use of at least one of the aforementioned inductive D.C. voltage and inductive RF detecting voltage (Vrf). That is, the matching unit 310 may further comprise an inductive D.C. voltage detecting unit 330 to detect the aforementioned inductive D.C. voltage since the matching unit 310 is used in common for the various apparatuses for plasma processing.

The inductive D.C. voltage detecting unit 330 may comprise a second filter 332, a second resistance (R2), and a fourth capacitor (C4).

The second filter 332 may comprise a second inductor (L2), and a fifth capacitor (C5).

On end of the second inductor (L2) is connected to the second node (N2), and the other end of the second inductor (L2) is connected to the fifth node (N5). In this case, the fifth node (N5) is connected in common to the other end of the second inductor (L2), one end of the second resistance (R2), and one end of the fifth capacitor (C5).

The fifth capacitor (C5) is connected between the fifth node (N5) and the ground.

The second filter 332 removes A.C. element from the waveform of the inductive RF voltage induced to the substrate supporting member 100 via the second node (N2) through the use of second inductor (L2) and fifth capacitor (C5).

The second resistance (R2) is connected between the fifth node (N5) and the fourth capacitor (C4).

The fourth capacitor (C4) is connected between the second resistance (R2) and a sixth node (N6). In this case, the sixth node (N6) is connected in common to the other end of the fourth capacitor (C4), and the RF generator 200.

The second resistance (R2) and fourth capacitor (C4) detect an inductive A.C. detecting voltage (Vdc) from the inductive RF voltage whose A.C. element is removed by the second filter 332.

The inductive D.C. voltage detecting unit 330 removes the A.C. element from the waveform of the inductive RF voltage through the use of second filter 332; detects the inductive A.C. detecting voltage (Vdc) from the inductive RF voltage whose A.C. element is removed by the second resistance (R2) and fourth capacitor (C4); and supplies the detected inductive A.C. detecting voltage (Vdc) to the RF generator 200.

Accordingly, the RF generator 200 controls the level of RF voltage according to the inductive D.C. detecting voltage (Vdc) supplied from the inductive D.C. voltage detecting unit 330, to thereby constantly maintain the RF voltage to be supplied to the substrate supporting member 100.

Meanwhile, the RF generator 200 controls the level of RF voltage according to at least one of the inductive RF detecting voltage (Vrf) supplied from the aforementioned inductive RF detecting circuit 324 and the inductive D.C. detecting voltage (Vdc) supplied from the inductive D.C. voltage detecting unit 330, to thereby constantly maintain the RF voltage to be supplied to the substrate supporting member 100.

The aforementioned apparatus for plasma processing according to the present invention enables to detect the inductive RF detecting voltage (Vrf) corresponding to the RF peak-to-peak voltage with high reliability by means of the inductive RF detecting circuit 324 by removing the noise frequency element from the waveform of the inductive RF voltage induced to the substrate supporting member 100 through the use of first filter 322 comprising the inductor (L1) and capacitor (C1), so that it is possible to constantly control the RF voltage supplied to the substrate supporting member 100 by precisely detecting the inductive RF voltage induced to the substrate supporting member 100.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An apparatus for plasma processing comprising:
a substrate supporting member for supporting a substrate, installed in a reaction room of a processing chamber;
a RF generator for supplying a RF voltage to the substrate supporting member so as to form plasma in the reaction room; and
a matching device for matching impedance of the RF voltage to be supplied to the substrate supporting member from the RF generator,
wherein the matching device comprises:
a matching unit for matching the impedance of RF voltage; and
an inductive RF detecting unit including a first filter connected to a node between the matching unit and the substrate supporting member, and an inductive RF detecting circuit connected to an output terminal of the first filter,
wherein the first filter removes noise frequency elements except a waveform of the RF voltage from a waveform of an inductive RF voltage induced to the substrate supporting member, and
wherein the inductive RF detecting circuit is configured to detect the inductive RF detecting voltage from the waveform of the inductive RF voltage from which the noise frequency elements are removed by the first filter, and supplies the detected inductive RF detecting voltage to the RF generator so as to control the RF voltage.

2. The apparatus according to claim 1, wherein the first filter comprises:

a first inductor with both ends, wherein one end of the first inductor is connected to the substrate supporting member, and the other end of the first inductor is connected to the inductive RF detecting circuit; and
a first capacitor with both ends, wherein one end of the first capacitor is connected to the other end of the first inductor, and the other end of the first capacitor is connected to ground.

3. The apparatus according to claim 2, wherein the inductive RF detecting circuit comprises:
a second capacitor connected between the other end of the first inductor and an output terminal of the inductive RF detecting voltage;
a third capacitor connected between the output terminal of the inductive RF detecting voltage and the ground; and
a first resistance between the output terminal of the inductive RF detecting voltage and the ground.

4. An apparatus for plasma processing comprising:
a substrate supporting member for supporting a substrate, the substrate supporting member installed in a reaction room of a processing chamber;
a RF generator for supplying a RF voltage to the substrate supporting member to form plasma in the reaction room; and
a matching device for matching impedance of the RF voltage to be supplied to the substrate supporting member from the RF generator,
wherein the matching device comprises:
a matching unit for matching the impedance of RF voltage;
an inductive RF detecting unit arranged and structured to detect an inductive RF detecting voltage by removing noise frequency elements except a waveform of the RF voltage from a waveform of an inductive RF voltage induced to the substrate supporting member, and to supply the detected inductive RF detecting voltage to the RF generator to control the RF voltage; and
an inductive D.C. voltage detecting unit for detecting an inductive D.C. detecting voltage by removing A.C. elements from the waveform of the inductive RF voltage induced to the substrate supporting member, and supplying the detected inductive D.C. detecting voltage to the RF generator.

5. The apparatus according to claim 4, wherein the inductive D.C. voltage detecting unit comprises:
a second filter for removing the A.C. elements from the waveform of the inductive RF voltage induced to the substrate supporting member;
a second resistance connected to the second filter; and
a fourth capacitor connected between the second resistance and the output terminal of the inductive RF detecting voltage.

6. The apparatus according to claim 5, wherein the second filter comprises:
a second inductor with both ends, wherein one end of the second inductor is connected to the substrate supporting member, and the other end of the second inductor is connected to the second resistance; and
a fifth capacitor connected between the other end of the second inductor and ground.

7. The apparatus according to claim 4, wherein the RF generator controls the RF voltage by at least one of the inductive RF detecting voltage and the inductive D.C. detecting voltage.

8. An apparatus for plasma processing comprising:
a RF generator for supplying a RF voltage to a substrate supporting member to form plasma;

a matching unit for matching an impedance of the RF voltage;

a first filter for connecting to a node between the matching unit and the substrate supporting member, and for filtering a waveform of the inductive RF voltage induced to the substrate supporting member; and an inductive RF detecting circuit for connecting to an output terminal of the first filter, detecting an inductive RF detecting voltage from the filtered waveform of the inductive RF voltage, and supplying the detected inductive RF detecting voltage to the RF generator.

9. The apparatus according to claim 8, wherein the first filter comprises:

a first inductor with both ends, wherein one end of the first inductor is connected to the substrate supporting member, and the other end of the first inductor is connected to the inductive RF detecting circuit; and a first capacitor with both ends, wherein one end of the first capacitor is connected to the other end of the first inductor, and the other end of the first capacitor is connected to ground.

* * * * *